(12) United States Patent
Lance et al.

(10) Patent No.: US 11,621,362 B2
(45) Date of Patent: Apr. 4, 2023

(54) SOLAR PANEL

(71) Applicant: MAXEON SOLAR PTE. LTD., Singapore (SG)

(72) Inventors: Tamir Lance, Los Gatos, CA (US); Nathan Beckett, Oakland, CA (US); Gilad Almogy, Palo Alto, CA (US); David B. DeGraaff, Mountain View, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 61 days.

(21) Appl. No.: 17/063,017

(22) Filed: Oct. 5, 2020

(65) Prior Publication Data

US 2021/0020800 A1 Jan. 21, 2021

Related U.S. Application Data

(63) Continuation of application No. 15/363,853, filed on Nov. 29, 2016, now Pat. No. 10,833,214.

(60) Provisional application No. 62/267,101, filed on Dec. 14, 2015.

(51) Int. Cl.
| | | |
|---|---|---|
| *H01L 31/05* | (2014.01) | |
| *H01L 31/044* | (2014.01) | |
| *H01L 31/18* | (2006.01) | |
| *H01L 31/043* | (2014.01) | |
| *H02S 40/36* | (2014.01) | |
| *H01L 31/02* | (2006.01) | |
| *H01L 31/028* | (2006.01) | |

(52) U.S. Cl.
CPC ........ *H01L 31/0516* (2013.01); *H01L 31/028* (2013.01); *H01L 31/02008* (2013.01); *H01L 31/043* (2014.12); *H01L 31/044* (2014.12); *H01L 31/0504* (2013.01); *H01L 31/18* (2013.01); *H02S 40/36* (2014.12); *Y02E 10/50* (2013.01)

(58) Field of Classification Search
CPC ............. H01L 31/043; H01L 31/02008; H01L 31/0504; H01L 31/0516
See application file for complete search history.

(56) References Cited

U.S. PATENT DOCUMENTS

| | | | |
|---|---|---|---|
| 4,966,631 A | 10/1990 | Matlin et al. | |
| 2005/0263178 A1* | 12/2005 | Montello | ............. H01G 9/2027 136/252 |
| 2006/0032527 A1 | 2/2006 | Stevens et al. | |
| 2008/0041434 A1 | 2/2008 | Adriani et al. | |

(Continued)

FOREIGN PATENT DOCUMENTS

| | | |
|---|---|---|
| CN | 102117815 A | 7/2011 |
| DE | 8518255 U1 | 9/1985 |

OTHER PUBLICATIONS

International Search Report corresponding to PCT/US16/064005, dated Apr. 3, 2017, 1 page.

(Continued)

*Primary Examiner* — Sadie White
(74) *Attorney, Agent, or Firm* — Schmidt Patent Law, Inc.

(57) ABSTRACT

A high efficiency configuration for a solar cell module comprises solar cells arranged in an overlapping shingled manner and conductively bonded to each other in their overlapping regions to form super cells, which may be arranged to efficiently use the area of the solar module.

18 Claims, 8 Drawing Sheets

(56) References Cited

U.S. PATENT DOCUMENTS

| | | |
|---|---|---|
| 2009/0025778 A1 | 1/2009 | Rubin et al. |
| 2011/0265857 A1 | 11/2011 | Wang et al. |
| 2012/0318319 A1 | 12/2012 | Pinarbasi et al. |
| 2013/0068279 A1 | 3/2013 | Buller et al. |
| 2014/0124014 A1 | 5/2014 | Morad et al. |
| 2015/0349145 A1 | 12/2015 | Morad et al. |
| 2015/0349703 A1* | 12/2015 | Morad .................. H01L 31/049 136/251 |

OTHER PUBLICATIONS

International Search Report and Written Opinion corresponding to PCT/US2016/064005, dated Apr. 3, 2017, 11 pages.

* cited by examiner

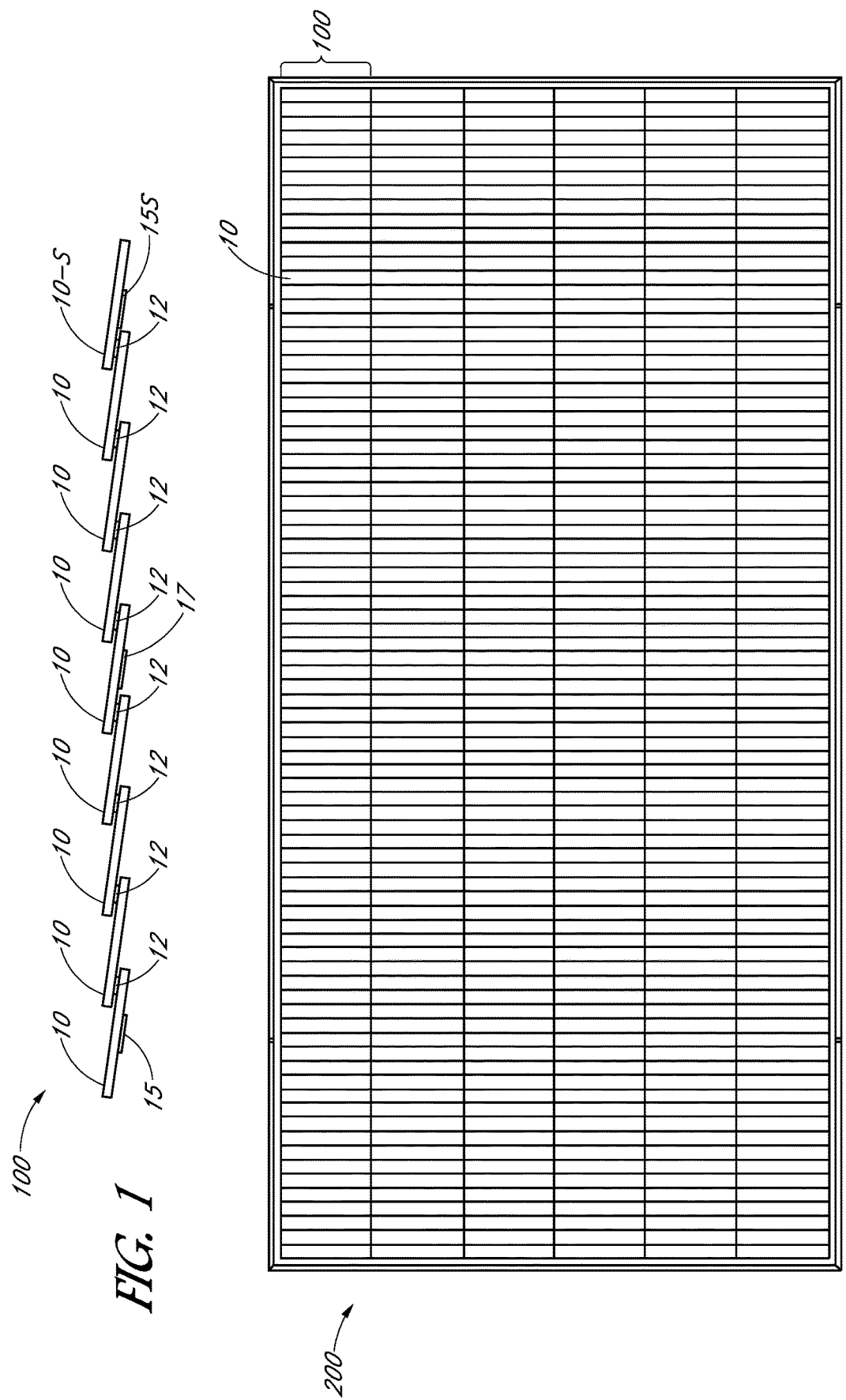

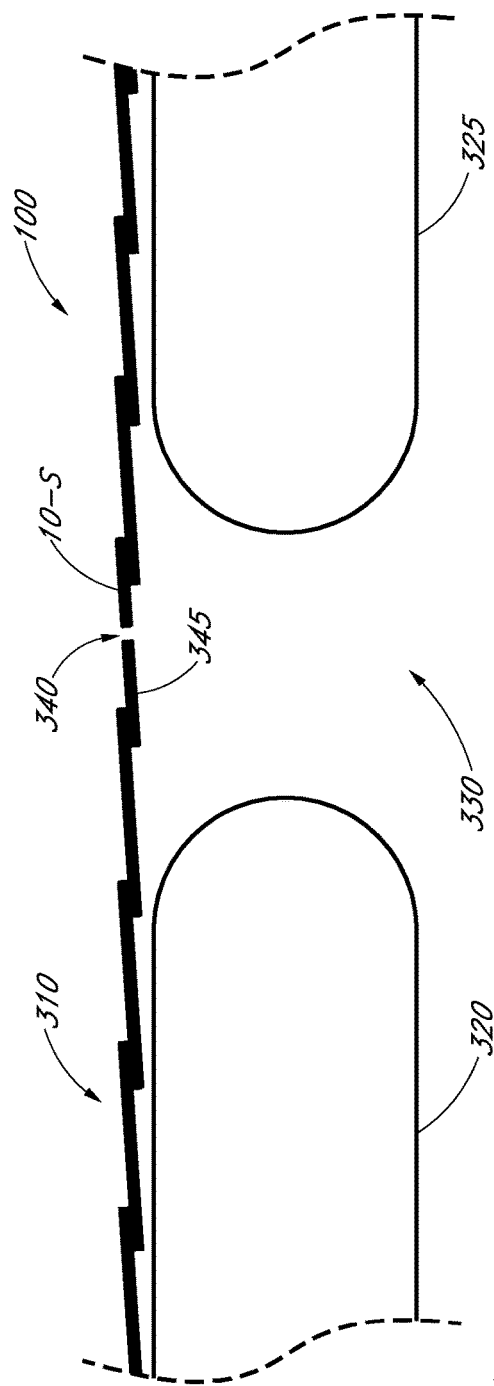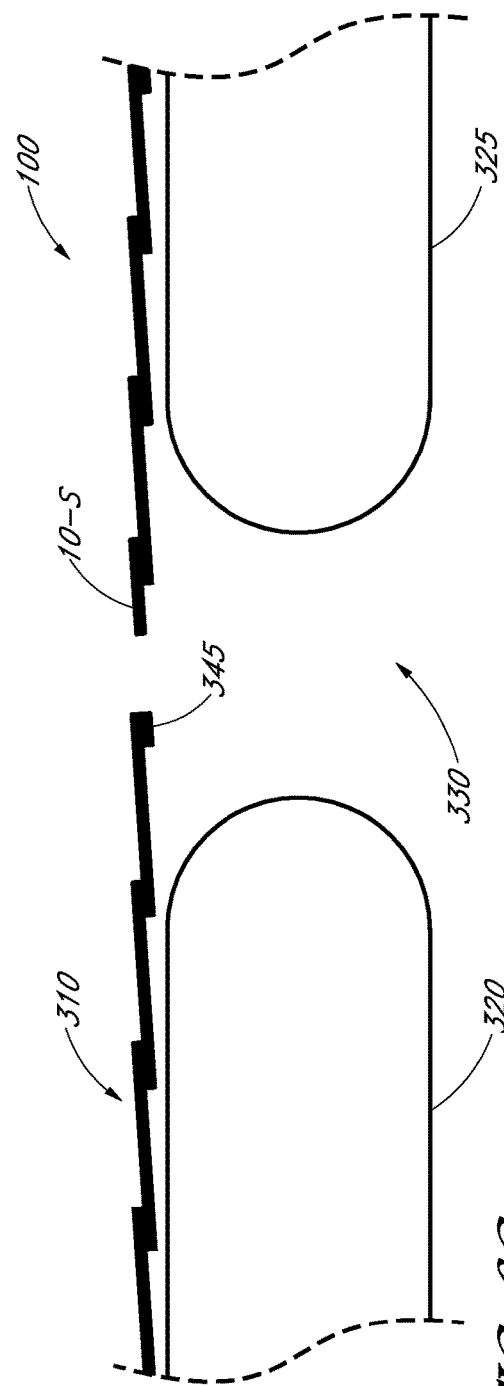
FIG. 6B
FIG. 6C

SOLAR PANEL

CROSS REFERENCE TO RELATED APPLICATIONS

This application is a continuation of U.S. patent application Ser. No. 15/363,853 filed Nov. 29, 2016, which claims benefit of priority to U.S. Provisional Patent Application 62/267,101 filed Dec. 14, 2015, each of which is incorporated herein by reference in its entirety.

STATEMENT REGARDING FEDERALLY SPONSORED RESEARCH OR DEVELOPMENT

This invention was made with government support under DE-EE0007190 awarded by The U.S. Department of Energy. The government has certain rights in the invention.

FIELD OF THE INVENTION

The invention relates generally to solar cell modules in which the solar cells are arranged in a shingled manner.

BACKGROUND

Alternate sources of energy are needed to satisfy ever increasing world-wide energy demands. Solar energy resources are sufficient in many geographical regions to satisfy such demands, in part, by provision of electric power generated with solar (e.g., photovoltaic) cells.

SUMMARY

In one aspect, a solar module comprises a first super cell comprising a plurality of (e.g., rectangular or substantially rectangular) silicon solar cells arranged in line with (e.g., long) sides of adjacent silicon solar cells overlapping in a shingled manner and conductively bonded to each other to electrically and mechanically connect the silicon solar cells in series. The first super cell also comprises a sacrificial cell that is arranged to overlap a front surface of an end one of the silicon solar cells in the same shingled manner and is conductively bonded to the front surface of the end one of the silicon solar cells to electrically and mechanically connect a rear surface of the sacrificial cell in series with the silicon solar cells. The module further comprises a first conductive lead conductively bonded to the rear surface of the solar cell that is located at the opposite end of the super cell from the sacrificial cell, and a second conductive lead conductively bonded to the rear surface of the sacrificial cell. The first conductive lead provides an electrical output from the super cell having a first polarity, and the second conductive lead provides an electrical output from the super cell having a second polarity opposite from the first polarity. During operation of the solar module, the sacrificial cell contributes no power to the solar module's electrical output. The sacrificial cell may be a silicon solar cell, for example.

Advantageously, the arrangement just summarized enables all electrical contacts to the solar cells in a solar module to be made from beneath the solar cells. This may facilitate manufacturing and provide an efficient and aesthetically pleasing module design.

In another aspect, a method for manufacturing a super cell from silicon solar cells comprises arranging silicon solar cells in line with sides of adjacent silicon solar cells overlapping in a shingled manner and conductively bonded to each other to form a shingled string of solar cells, and separating a first super cell from an end portion of the shingled string of solar cells to leave a remaining portion of the shingled string of solar cells. The first super cell comprises a plurality of the silicon solar cells arranged in line with sides of adjacent silicon solar cells overlapping in a shingled manner and conductively bonded to each other to electrically and mechanically connect the silicon solar cells in series.

The method may further comprise arranging additional silicon solar cells in line with the remaining portion of the shingled string of solar cells with sides of adjacent silicon solar cells overlapping in a shingled manner and conductively bonded to each other to extend the shingled string of solar cells, and separating a second super cell from an end portion of the shingled string of solar cells to leave a remaining portion of the shingled string of solar cells. Like the first super cell, the second super cell comprises a plurality of the silicon solar cells arranged in line with sides of adjacent silicon solar cells overlapping in a shingled manner and conductively bonded to each other to electrically and mechanically connect the silicon solar cells in series.

The first and second super cells may be separated from a first end of the shingled string of solar cells, and the additional silicon solar cells added to a second end of the shingled string of solar cells opposite from the first end.

Separating the first super cell from the shingled string of solar cells may comprise making a first laser cut in a solar cell in a direction transverse to a long axis of the shingled string of solar cells. The first laser cut may be made through the solar cell to thereby separate the first super cell from the shingled string of solar cells. An optional second laser cut may be made to trim off a portion of the cut solar cell remaining attached to an end of the shingled string of solar cells. Optionally, the first laser cut and/or second laser cut may be made only partially through the solar cell to form a score line along which the solar cell may later be cleaved to separate the first super cell and/or to trim off a portion of a cut solar cell remaining attached to an end of the shingled string of solar cells.

A portion of the cut solar cell remaining attached to the first super cell may optionally be used as a narrow sacrificial cell.

Alternatively, separating the first super cell from the shingled string of solar cells may comprise melting a conductive bond between two adjacent solar cells. In such variations an end solar cell to be used as a sacrificial cell may optionally be trimmed with a laser cut, for example, to narrow it.

Similarly, a portion of a cut solar cell remaining attached to an end of the shingled string of solar cells may be removed by melting the conductive bond to its adjacent solar cell.

The method just summarized may enable efficient production of super cells and facilitate the use of sacrificial cells as described herein.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIG. 1 shows a cross-sectional diagram of a string of series-connected solar cells arranged in a shingled manner with the ends of adjacent solar cells overlapping to form a shingled super cell.

FIG. 2 shows a diagram of the front surface of an example rectangular solar module comprising a plurality of rectangular shingled super cells, with the long side of each super cell having a length of approximately the full length of the long side of the module. The super cells are arranged with their long sides parallel to the long sides of the module.

FIG. 6B shows an expanded view of the system of FIG. 6A in which a single cut is used to separate a super cell of desired length from the shingled string of super cells. FIG. 6C shows an expanded view of the system of FIG. 6B in which one cut separates a super cell of desired length from the shingled string of solar cells and a second cut trims a portion of a solar cell left at an end of the shingled string by the first cut.

DETAILED DESCRIPTION

Figure 3:
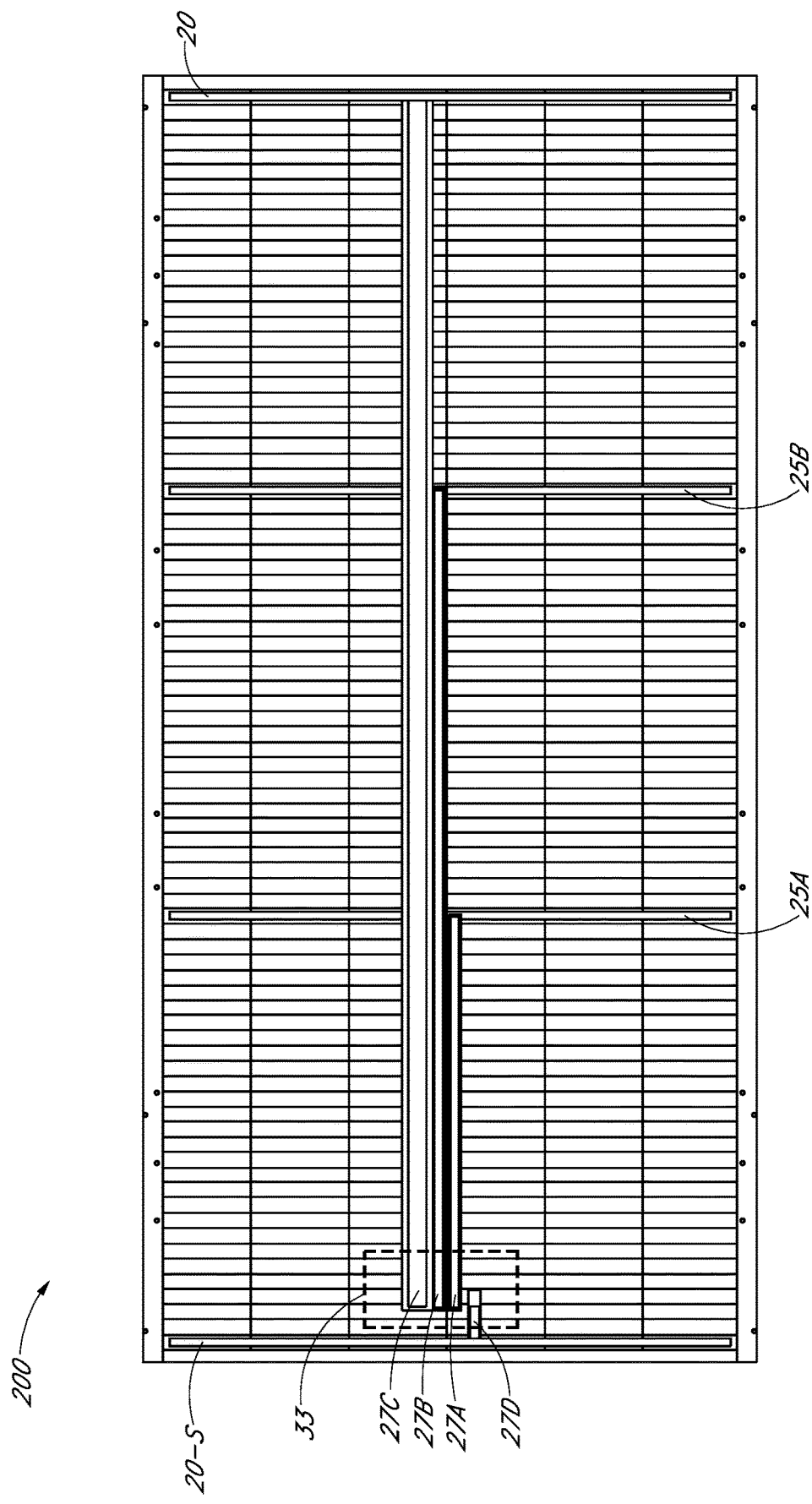
FIG. 3 shows a diagram of the rear surface of the example solar module of FIG. 2.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "substantially parallel" and to encompass minor deviations from parallel geometries. The term "perpendicular" is intended to mean "perpendicular or substantially perpendicular" and to encompass minor deviations from perpendicular geometries rather than to require that any perpendicular arrangement described herein be exactly perpendicular. The term "square" is intended to mean "square or substantially square" and to encompass minor deviations from square shapes, for example substantially square shapes having chamfered (e.g., rounded or otherwise truncated) corners. The term "rectangular" is intended to mean "rectangular or substantially rectangular" and to encompass minor deviations from rectangular shapes, for example substantially rectangular shapes having chamfered (e.g., rounded or otherwise truncated) corners. The term "identical" is intended to mean "identical or substantially identical" and to encompass minor deviations in shape, dimensions, structure, composition, or configuration, for example.

This specification discloses high-efficiency solar modules (also referred to herein as solar panels) comprising silicon solar cells arranged in an overlapping shingled manner and electrically connected in series by conductive bonds between adjacent overlapping solar cells to form super cells, with the super cells arranged in physically parallel rows in the solar module. A super cell may comprise any suitable number of solar cells. The super cells may have lengths spanning essentially the full length or width of the solar module, for example, or two or more super cells may be arranged end-to-end in a row. This arrangement hides solar cell-to-solar cell electrical interconnections and increases the efficiency and the aesthetic attractiveness of the module.

As explained in more detail below, this specification further discloses the use of a "sacrificial cell" located at an end of each super cell to facilitate making all electrical connections to the super cell from the back side of the super cell.

Turning now to the figures for a more detailed understanding of the solar modules described in this specification, FIG. 1 shows a cross-sectional view of a string of series-connected solar cells 10 arranged in a shingled manner with the ends of adjacent solar cells overlapping and electrically connected to form a super cell 100. Each solar cell 10 comprises a semiconductor diode structure and electrical contacts to the semiconductor diode structure by which electric current generated in solar cell 10 when it is illuminated by light may be provided to an external load. Super cell 100 also includes a sacrificial cell 10-S located at an end of the string of shingled solar cells, overlapping and electrically connected to the front surface of the adjacent solar cell.

In the examples described in this specification, each solar cell 10 is a rectangular crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, other material systems, diode structures, physical dimensions, or electrical contact arrangements may be used if suitable. For example, the front (sun side) surface metallization pattern may be disposed on a semiconductor layer of p-type conductivity, and the rear (shaded side) surface metallization pattern disposed on a semiconductor layer of n-type conductivity.

Rectangular solar cells 10 may be prepared, for example, by separating a standard size square or pseudo-square solar cell wafer into two or more (i.e., N) rectangular solar cells each having a length equal to the side length (e.g., 156 millimeters) of the standard sized solar cell wafer and a width equal to a fraction (i.e., about 1/N) of the side length of the standard sized solar cell wafer. N may be, for example, 2 to 20 or more, for example 6 or 8.

Solar cells 10 may also be prepared, for example, by separating a standard size square or pseudo-square solar cell wafer along a first set of N−1 (e.g., cleave) lines parallel to one side of the wafer and along a second set of P−1 lines oriented perpendicular to the first set of lines to form N×P solar cells having widths of about 1/N of the side length of the standard size wafer and lengths of about 1/P of the side length of the standard size wafer. For example, for N=6 and P=2 a standard size wafer having side lengths of 156 millimeters would provide 12 rectangular solar cells 10 each having a width of about 26 millimeters and a length of about 78 millimeters.

Referring again to FIG. 1, in super cell 100 adjacent solar cells 10, and sacrificial cell 10-S and its adjacent solar cell, are conductively bonded to each other in the region in which they overlap by an electrically conductive bonding material 12 that electrically connects the front surface metallization pattern of one cell to the rear surface metallization pattern of the adjacent cell. Suitable electrically conductive bonding materials may include, for example, electrically conductive adhesives and electrically conductive adhesive films and adhesive tapes, and conventional solders.

A terminal lead 15 (e.g., a metal ribbon) is conductively bonded to rear surface metallization of the solar cell 10 at one end (in FIG. 1, the left end) of super cell 100 to provide an electrical output of one polarity (either positive or negative) from the super cell. Another terminal lead 15-S (e.g., a metal ribbon) is conductively bonded to rear surface metallization of sacrificial cell 10-S, and electrically connected to the front surface metallization of the adjacent solar cell 10 through the rear surface metallization of sacrificial cell 10-S and through the conductive bond between the two cells, to provide a second electrical output of opposite polarity from the super cell. Cell 10-S is "sacrificial" in the sense that in operation of the super cell sacrificial cell 10-S, even if it is a solar cell identical to solar cells 10, contributes no power to the super cell output because electrical contact is made to only the rear side of the sacrificial cell.

The use of sacrificial cell 10-S as just described is advantageous because it allows outputs of both polarities from the super cell to be provided from the rear of the super cell. In contrast, in the absence of sacrificial cell 10-S an alternative approach would be to bond a first terminal lead to rear surface metallization of a solar cell 10 at one end of the super cell to provide an electrical output of one polarity, and to bond a second terminal lead to front surface metallization of a solar cell 10 at the opposite end of the super cell to provide an electrical output of the other polarity. As further described below, providing outputs of both polarities from the rear surface of the super cell simplifies lay-up of a solar module during the manufacturing process.

In addition, terminal lead 15-S used with a sacrificial cell as just described may be wider than an alternative front surface terminal lead, because terminal lead 15-S is not shadowing any portion of active solar cell area, and consequently may also be thinner and more mechanically compliant than a conventional front surface terminal lead. This may advantageously reduce stress on the bond between the lead and the sacrificial cell. Further, the tolerance on the position and alignment of terminal lead 15-S may be greater (i.e., more error in the placement of the terminal lead 15-S is acceptable) than that for a front surface terminal lead. Further still, hiding all electrical contacts to the super cell behind the rear surface of the super cell may provide a more aesthetically pleasing arrangement, when viewed from the front.

Terminal lead 15 and terminal lead 15-S are shown in FIG. 1 as bonded to central portions of the rear surface of, respectively, end solar cell 10 and sacrificial cell 10-S. Any other suitable location on the back surface of end solar cell 10 and sacrificial cell 10-S may also be used. For example, the terminal leads may be located adjacent the outer edges of end solar cell 10 and sacrificial cell 10-S.

A disadvantage to the use of a "sacrificial cell" as just described is that, as noted above, it produces no output power. Module output power may therefore be reduced. Further, if sacrificial cell 10-S is a solar cell its cost may be viewed as wasted. Applicant has discovered, however, that the manufacturing advantages arising from use of a sacrificial cell may outweigh these disadvantages.

Sacrificial cell 10-S may be identical or substantially identical to solar cells 10. Sacrificial cell 10-S may have identical or substantially identical dimensions as solar cells 10. Sacrificial cell 10-S may be a solar cell having identical or substantially identical dimensions to solar cells 10. Sacrificial cell 10-S may be a solar cell having identical or substantially identical front and rear surface metallization as solar cells 10. Sacrificial cell 10-S may be a solar cell except for lacking front surface metallization. Sacrificial cell 10-S may be a damaged or otherwise rejected solar cell that fails a screening test passed by solar cells 10. Sacrificial cell 10-S need not be a solar cell, but instead may be for example a silicon wafer not comprising a diode junction. Sacrificial cell 10-S may comprise or function as a bypass-diode or provide some other electrical function. Sacrificial cell 10 may be narrower (measured perpendicular to its long sides) than solar cells 10, to reduce inactive area.

Sacrificial cell 10-S may advantageously be formed from the same material (e.g., silicon) as solar cells 10, to match the thermal coefficient of expansion of the sacrificial cell to the solar cells. In some variations sacrificial cell 10-S is formed from the same material (e.g., silicon) as solar cells 10, has the same length, width, and thickness as solar cells 10, is processed by the same equipment as solar cells 10 (for example, for placing and bonding in the super cell), and is bonded to the adjacent solar cell with the same bonding material used to bond adjacent solar cells to each other. Sacrificial cell 10-S may, however, be bonded to the adjacent solar cell using a bonding material different from that used to bond adjacent solar cells to each other.

Still referring to FIG. 1, one or more additional conductive leads (e.g., metal ribbons) 17 may each be conductively bonded to the rear surface metallization of a corresponding solar cell located at an intermediate position between the ends of the super cell. Leads 17 may be used, for example, to create bypass diode circuits around segments of the super cell.

FIG. 2 shows a front view of an example rectangular solar module 200 comprising six rectangular super cells 100, each of which has a length approximately equal to the length of the long sides of the solar module. FIG. 3 shows a rear view of example solar module 200. In this example the super cells are arranged as six parallel rows with their long sides oriented parallel to the long sides of the module. A similarly configured solar module may include more or fewer rows of such side-length super cells than shown in this example. In other variations the super cells may each have a length approximately equal to the length of a short side of a rectangular solar module, and be arranged in parallel rows with their long sides oriented parallel to the short sides of the module. In yet other arrangements each row may comprise two or more super cells, which may be electrically interconnected in series for example. The modules may have short sides having a length, for example, of about 1 meter and long sides having a length, for example, of about 1.5 to about 2.0 meters. Any other suitable shapes (e.g., square) and dimensions for the solar modules may also be used. A super cell may comprise any suitable number of rectangular solar cells of any suitable dimensions. Similarly, a row of super cells may comprise any suitable number of rectangular solar cells of any suitable dimensions arranged in one or more super cells.

Solar modules as described herein typically comprise many more (e.g., N times) as many solar cells as a conventional module of the same size because N rectangular solar cells are formed from a single conventional sized solar cell wafer. Optionally, the super cells formed from these solar cells may be arranged in an electrically parallel/series combination that provides current and voltage outputs similar to those provided by a solar module of about the same size comprising series-connected conventional size solar cells. For example, if a conventional module includes M conventional size solar cells electrically connected in series, then a corresponding shingled super cell module comprising N electrically parallel rows of super cells with each super cell row comprising M series connected rectangular solar cells (each having 1/N the area of a conventional solar cell) would provide about the same voltage and current output as the conventional module.

Any other suitable series, parallel, or series and parallel electrical interconnection of the super cells in a solar module may also be used.

Example solar module 200 of FIG. 2 and FIG. 3 comprises six rows of super cells all of which are electrically interconnected in parallel by terminal interconnect 20 (e.g., a metal ribbon) at one end of the rows and by terminal interconnect 20-S (e.g., a metal ribbon) at the other end of the rows. Terminal interconnect 20 runs transversely to the rows of super cells to interconnect terminal leads 15 (not shown in FIG. 3), and terminal interconnect 20-S runs transversely to the rows of super cells to interconnect terminal leads 15-S (not shown in FIG. 3). Any other suitable manner of electrically connecting the ends of rows of super cells may also be used. For example, rather than being used to interconnect terminal leads 15 and terminal leads 15-S, terminal interconnect 20 and terminal interconnect 20-S may be directly bonded to the rear surfaces of solar cells over which they pass and thus replace terminal leads 15 and terminal leads 15-S.

Still referring to FIG. 3, intermediately positioned interconnects 25A and 25B (e.g., metal ribbons) each run transversely to the rows of super cells to electrically interconnect leads 17 (not shown in FIG. 3). Any other suitable manner of interconnecting adjacent solar cells in adjacent super cells at an intermediate position between the ends of the super cells may also be used. For example, rather than being used to interconnect leads 17, interconnects 25A and 25B may be directly bonded to the rear surfaces of solar cells over which they pass and thus replace leads 17.

Typically, though not necessarily, the solar modules described herein comprise one or more (e.g., three) bypass diodes. If a solar cell arranged electrically in parallel with one of the bypass diodes significantly limits current due to shading, cracking, or otherwise suboptimal cell performance, the bypass diode will become forward biased and electrically bypass that solar cell or a portion of the module including that solar cell. This prevents formation of a dangerous hot spot around the current limiting cell and improves performance of the module.

Figure 4:
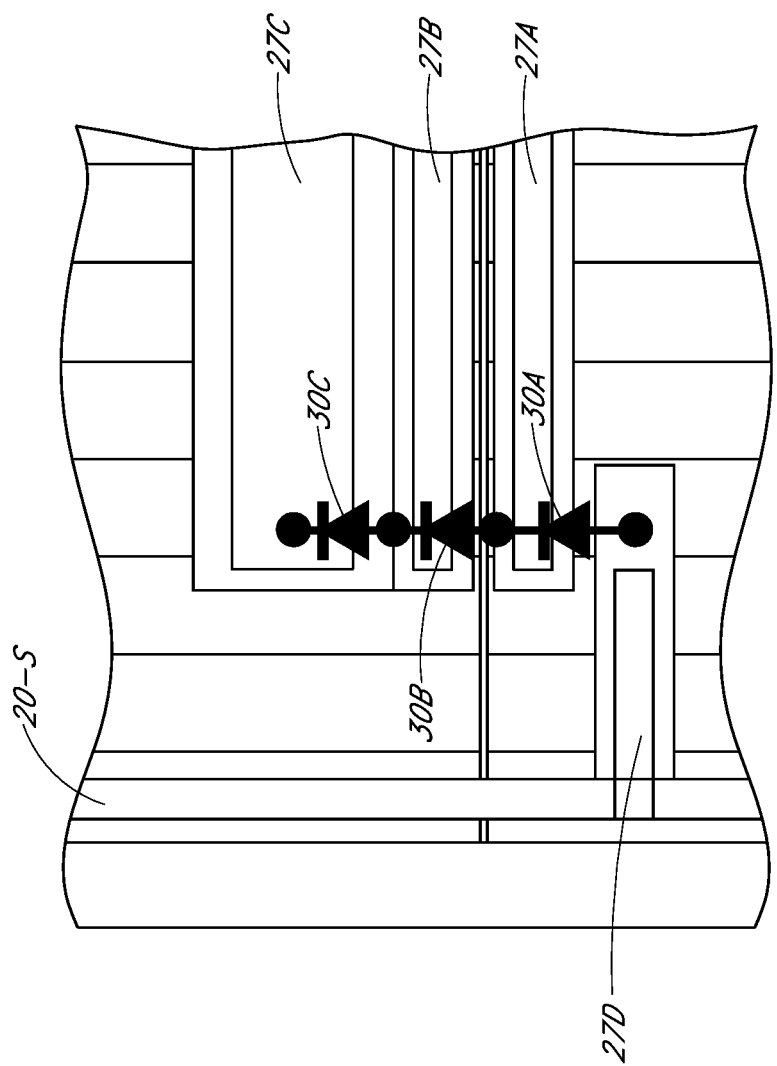
FIG. 4 shows an expanded view of an example interconnection of bypass diodes to the super cells in the example solar module of FIG. 2 and FIG. 3.
Figure 5:
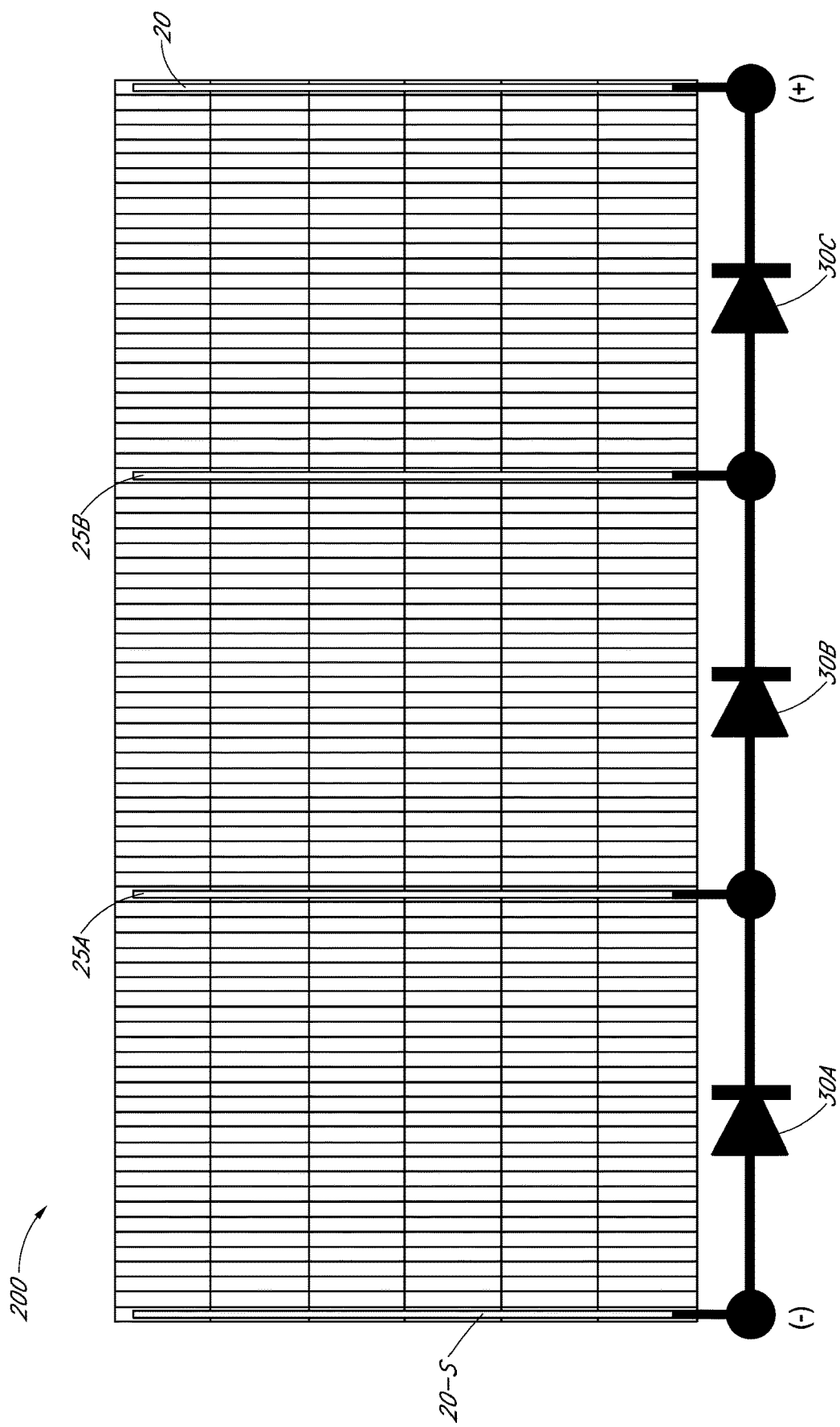
FIG. 5 schematically illustrates the electrical interconnection of bypass diodes to the super cells in the example solar module of FIG. 2 and FIG. 3.

Referring again to FIG. 3, and also to the expanded view shown in FIG. 4, in the illustrated example conductors (e.g., metal ribbons) 27A, 27B, 27C, and 27D electrically connect interconnect 25A, interconnect 25B, terminal interconnect 20, and terminal interconnect 20-S, respectively, to bypass diodes 30A, 30B, and 30C in a junction box 33 (shown in phantom in FIG. 3). FIG. 5 schematically illustrates the resulting bypass diode circuit. Any other suitable bypass diode arrangement may also be used.

Shingled solar modules as described herein may be constructed as follows, for example. As described above, standard size square or pseudo square solar cells are diced to separate each standard solar cell into two or more rectangular or substantially rectangular solar cells. The rectangular or substantially rectangular solar cells are then arranged in an overlapping manner and conductively bonded to each other to form super cells.

In a subsequent lay-up step, the super cells are arranged sunny side down on a transparent front sheet (e.g., a glass sheet) in the physical configuration desired for the module. An encapsulant layer or sheet may optionally be positioned between the super cells and the transparent front sheet. All leads, interconnects, and other conductors described above, or their equivalents or substitutes, if intended to be present in the finished solar module, are then arranged in the desired physical configuration on the rear surfaces of the super cells.

As previously noted, with the use of sacrificial cells as described above all electrical connections to the super cells may be made from the rear of the super cells. Consequently, it is not necessary to form any electrical connections to front surfaces of the super cells before or during the lay-up step. This simplifies construction of the solar module compared to a case, for example, in which a terminal connection to each super cell must be made on the front surface of the super cell and therefore access to both front and rear surfaces of each super cell is required.

Terminal leads 15 and 15-S and leads 17 (if present) may be bonded to the rear surfaces of corresponding super cells with any suitable electrically conductive adhesive, solder, or other electrically conductive connection before lay-up (at the time of super cell construction for example), or during lay-up as or after the super cells have been arranged on the transparent front sheet, or in a later lamination step described below. The various additional interconnects and conductors may be bonded to each other or to the leads 15, 15-S, and 17, as appropriate, with solder, for example, during or after lay-up or during lamination.

After the super cells and the other module components referred to above are arranged in the desired physical configuration, a backing sheet is positioned on top of the arranged components. An encapsulant layer or sheet may optionally be positioned between the backing sheet and the super cells. The resulting structure is subjected to heat and pressure to form a laminate.

Referring again to FIG. 2, super cells 100 may be centered lengthwise along the length of module 200, as shown in the figure, with the distance from one end of a super cell to the edge of the module to which it is adjacent the same or approximately the same as the distance from the other end of the super cell to the opposite edge of the module. Alternatively, rather than super cells 100 being centered lengthwise along the length of the module 200, the super cells may be arranged so that there active front surface areas (i.e., the super cell excluding the sacrificial cell) are centered lengthwise along the length of module 200. In the latter case the distance between the sacrificial cell end of a super cell and the edge of the module to which it is adjacent is less than the distance between the other end of the super cell and the opposite edge of the module. The latter arrangement provides the same buffer distance between the active area of the super cell and the edge of the module at both ends of the super cell. The buffer distance helps prevent or reduce soiling of the active area of the super cell.

Any other method of constructing the solar modules described herein may also be used.

In some variations, super cells for use in the modules disclosed herein are formed by separating (e.g., cutting) desired lengths of shingled solar cells from a longer shingled string of solar cells. The longer shingled string of solar cells may optionally be continuously produced, i.e., additional solar cells may be added to one end of the string in an overlapping shingled manner to continuously build the shingled string and super cells of desired length separated from the other end of the shingled string as it is built. The super cells may be separated from the end of the shingled string with one or more cuts made with a laser, for example, or with any other suitable cutting mechanism or method, or by melting the (e.g., adhesive) bond between a pair of adjacent solar cells in the shingled string.

If the super cells are separated from the end of the shingled string by cutting through a solar cell in an interior portion of the shingled string, the cutting process may leave a narrow (less than full width) portion of a cut solar cell attached to one end of the super cell, and another narrow portion of the cut solar cell attached to the end of the shingled string. Because of its origin in an interior portion of the shingled string, one or the other of the two portions of the cut solar cell is conductively bonded to the front surface of its adjacent solar cell, and can therefore function as a sacrificial cell in a super cell as described above.

Figure 6A:
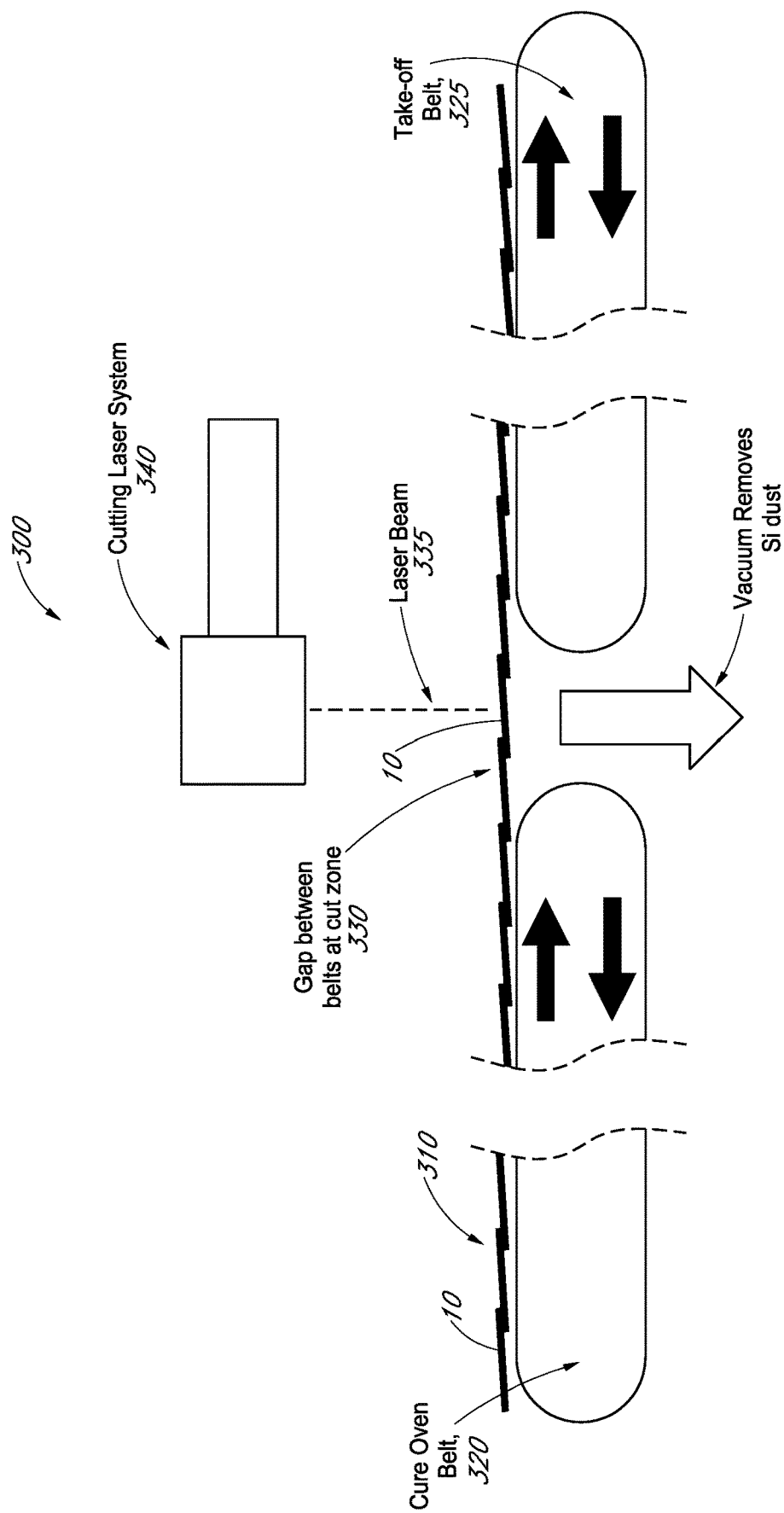
FIG. 6A shows a cross-sectional schematic view of an example system for cutting super cells of desired length from a longer, e.g. continuously produced, shingled string of solar cells.

FIGS. 6A-C show cross-sectional schematic views of an example system 300 for cutting super cells 100 of desired length from a longer shingled string 310 of solar cells. In this example, shingled string 310 of solar cells is continuously formed by adding solar cells 10 to one end (in FIGS. 6A-6C, the left most end) of the shingled string. The continuously formed shingled string is carried by cure oven conveyor belt 320 through an oven (not shown) that cures a conductive adhesive disposed between the overlapping ends of adjacent solar cells to form conductive bonds between adjacent solar cells, and transferred from conveyor belt 320 to take-off conveyor belt 325 across a gap 330. Conveyor belt 320 and conveyor belt 325 are typically arranged in line with each other, as illustrated. Typically, conveyor belt 320 moves in steps, rather than continuously, to allow an additional solar cell to be added to the left end of the string during each pause between steps. This is not required, however. Additional solar cells may optionally be added to the end of shingled string 310 while it is in motion, although this may be mechanically complicated.

In the illustrated example, a cutting laser beam 335 provided by cutting laser system 340 makes one or more cuts transverse to the long axis of shingled string 310 through a solar cell 10 positioned in gap 330 between the conveyor belts to separate a super cell 100 from the shingled string. Any suitable cutting laser system may be used. In the illustrated arrangement the cutting laser will not damage either of the conveyor belts because the cut solar cell is positioned in gap 330 between the conveyor belts when the one or more cuts are made. As shown in FIG. 6A, this positioning also facilitates vacuum removal of silicon dust and/or other debris resulting from the cuts.

The laser cuts may be made as straight lines running transversely to the long axis of shingled string 310. Alternatively, the laser cuts may be made as curving (e.g., wavy) lines, or as a combination of straight and curved line segments, or as a combination of straight line segments that intersect each other at one or more angles, to form a cut that runs generally transverse to the long axis of shingled string 310. The laser cut may therefore define protrusions and/or concave cutouts along the cut edges of the two portions of the cut solar cell, as for example described later in this specification with respect to FIGS. 7A-7B and 8A-8B.

The one or more cuts through a solar cell 10 made to separate a super cell 100 from shingled string 310 are typically made during one or more pauses in the movement of conveyor belt 320 and shingled string 310. For example, a cut may be made during a pause in which a solar cell 10 is added to the end of shingled string 310. To make more than one cut through the same solar cell, conveyor belt 320 may be moved less than a full cell width between cuts, or conveyor belt 320 may remain stationary between cuts and cutting laser beam 335 directed to make the one or more cuts at separate locations along the solar cell.

The movement of conveyor belt 320 and conveyor belt 325 is typically synchronized during periods in which shingled string 310 extends across gap 330 and is in contact with both belts. After a super cell 100 has been cut from the end of shingled string 310 and before shingled string 310 has advanced far enough to again be in contact with both conveyor belts, conveyor belt 325 may optionally be accelerated or otherwise operated to increase the distance between super cell 100 and the end of shingled string 310 to facilitate later handling of super cell 100.

Cameras and a machine vision system (not shown) may be used to control the movement of the conveyor belts so that the appropriate solar cells are cut to provide super cells of the desired lengths. Alternatively, a control system may rely on indexing and known positions of the solar cells based on their initial placement in shingled string 310 on conveyor belt 320 to ensure that the appropriate solar cells are cut to provide super cells of the desired lengths.

FIG. 6B shows an expanded view of the system of FIG. 6A in which a single cut 340 has been used to separate a super cell 100 of desired length from the shingled string of super cells and to create a sacrificial cell 10-S of desired width at the end of the super cell 100. Such a single cut may be made at any suitable location along the cut solar cell 10. The cut may be located, for example, to create a sacrificial cell 10-S having a width of about ½ or about ⅓ the full width of a solar cell 10 as measured along the long axis of shingled string 310.

FIG. 6C shows an expanded view of the system of FIG. 6B in which a first cut has been used to separate a super cell 100 of desired length from the shingled string of solar cells and to create a sacrificial cell 10-S of desired width, and an optional second cut has been used to remove some of remaining portion 345 of the cut solar cell 10 at the end of shingled string 310. Remaining portion 345 may be trimmed near to or flush with the edge of the solar cell to which it is bonded, for example. The two cuts together cut out an interior portion of the cut solar cell 10, which may be collected as debris from below gap 330 between the conveyor belts.

In some variations, a first laser cut is made to create a sacrificial cell having a width of about ⅓ the full of a solar cell 10 at the end of super cell 100, and a second laser cut is made to remove most or all of remaining portion 345 of the cut solar cell extending from shingled string 310. In some other variations, a single laser cut is made to create a sacrificial cell and a remaining cut cell portion 345 each having a width of about ½ the full width of a solar cell 10, and the remaining portion 345 is retained on the next super cell cut from shingled string 310 as installed in a module.

In the laser cutting process described above the laser cuts all the way through a solar cell 10 to separate a super cell 100 from the shingled string 310. Alternatively, the laser cut (or cuts) may be made only partially through a solar cell 10 to create one or more score lines along which the solar cell may be subsequently cleaved to separate the super cell 100 from the shingled string 310 and, optionally, to remove some or all of remaining portion 345 of the cut cell.

In some variations, laser beam 335 may be used to heat the overlapping portions of two adjacent solar cells 10 in shingled string 310 to melt the conductive adhesive bonding the two solar cells to each other. In such variations laser beam 335 may, for example, be defocused and/or operated at different (lower or higher) power than when used for cutting. This melting process may be used instead of laser cutting to separate a super cell 100 from shingled string 310, for example. This melting process may also be used to remove remaining portion 345 of a cut solar cell from the end of shingled string 310. Optionally, two different lasers may be used, one for the cutting process and one for the melting process.

In some variations, a laser cut is used to separate a super cell 100 from shingled string 310, after which the same or a different laser is used to melt the bond between remaining portion 345 of the cut solar cell and shingled string 310. In some other variations, a laser is used to melt the bond between two overlapping solar cells 10 in shingled string 310 to separate a super cell 100 from the shingled string, after which the resulting full width sacrificial cell on the end of super cell 100 is narrowed to a desired width using a laser cut made with the same or a different laser.

In some variations, any of the melting steps described above may be performed using a different heat source instead of a laser beam.

Optionally, system 300 described above and similar systems may be used in combination with an inspection system to identify and remove (e.g., cut or melt out) cracked or otherwise defective solar cells in a shingled string 310 or in a previously separated super cell 100. Any resulting strings of shingled solar cells having lengths less than that desired for super cells 100 may be subsequently assembled into super cells 100 of desired lengths by bonding the short shingled strings to each other to form a super cell of desired or greater than desired length and then removing any excess solar cells by the methods described above, for example.

Referring again to FIG. 1, in some variations terminal leads 15 and 15-S and conductive leads 17, or their equivalent, are bonded only to discrete contact pads on the rear surfaces of their respective cells, not to the entire portion of the surface over which they lie. In such cases, voids may form between the leads and the cells. Moisture may migrate into those voids and eventually degrade performance of the super cell.

In some variations, a layer of encapsulant is positioned between each lead and its respective cell to form a moisture barrier and prevent formation of voids, with cut-outs in the encapsulant layer allowing for the conductive bonds between the leads and discrete contact pads to which they are conductively bonded. Placing the layer of encapsulant between the leads and the cells may add a process step, however, which can increase manufacturing complexity and cost.

In other variations, terminal leads 15 and 15-S are comb-like ribbons with finger-like protrusions that extend perpendicularly to their long axes. Each finger-like protrusion is bonded to a discrete contact pad on an end solar cell or a sacrificial cell, with the remaining portion of the ribbon positioned off of the end of the super cell so that the overlap of each lead and its cell occurs primarily at the discrete contact pads. This may reduce or eliminate formation of voids as described above. Such comb-like ribbons may be difficult or expensive to manufacture from desirably thin conductive sheets, however.

Referring now to FIGS. 7A-7B and 8A-8B, in some variations a sacrificial cell 10-S has an outer edge to be positioned away from the super cell that includes protrusions 400 in the plane of the cell that protrude outward from the super cell along the line of the super cell. Each of the discrete contact pads 410 in the rear surface metallization of the sacrificial cell is located on a corresponding one of these protrusions. This allows a straight ribbon-like conductor 420 (e.g., a terminal lead 15-S) to be conductively bonded to the discrete contact pads on a sacrificial cell without overlying other portions of the cell. This may reduce or eliminate formation of voids as described above.

A similar configuration may also be suitable and similarly advantageous for an end solar cell 10 located at the end of a super cell, so long as the dimensions of that end solar cell are adjusted so that it has the same or substantially the same active area as the other solar cells 10 in the string and is therefore current matched to the other solar cells.

Figure 7A:
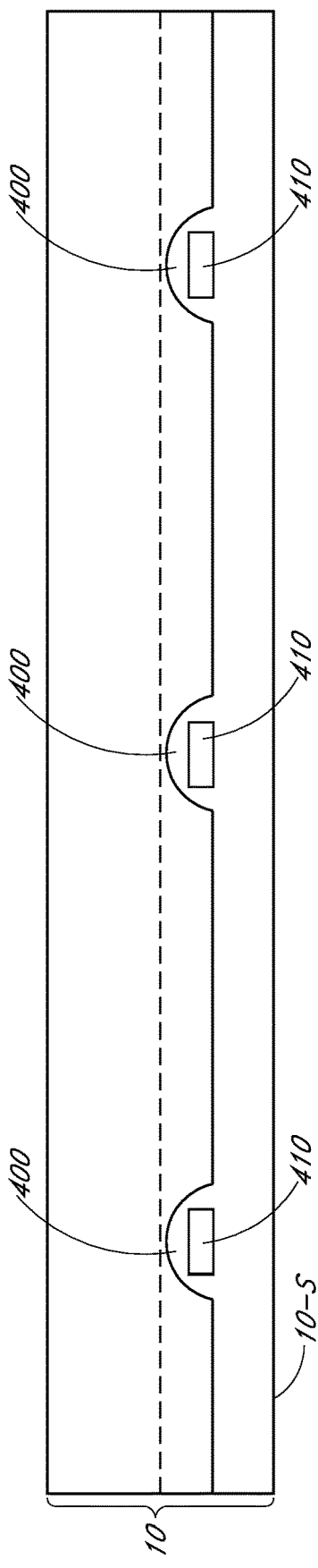
FIGS. 7A-7B show an example sacrificial cell 10-S in which rear metallization pattern discrete contact pads are located on protrusions extending from an edge of the sacrificial cell, and an example of how such a sacrificial cell may be cut from a rectangular solar cell 10.
Figure 7B:
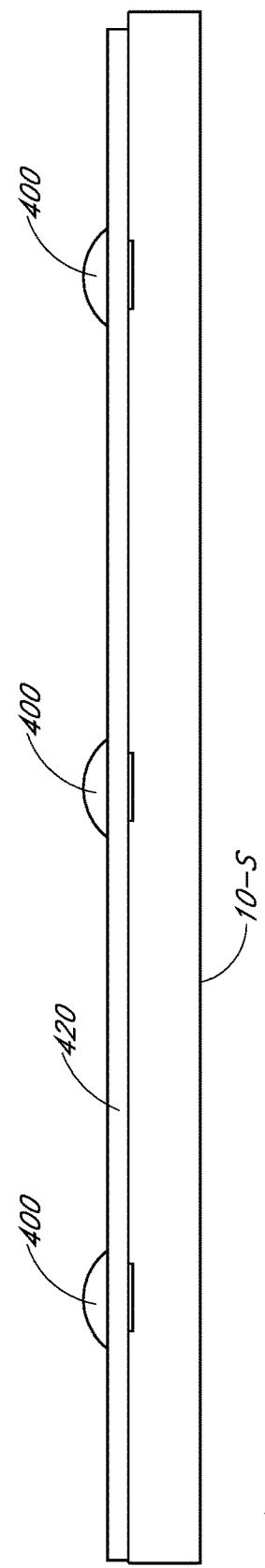
Figure 8A:
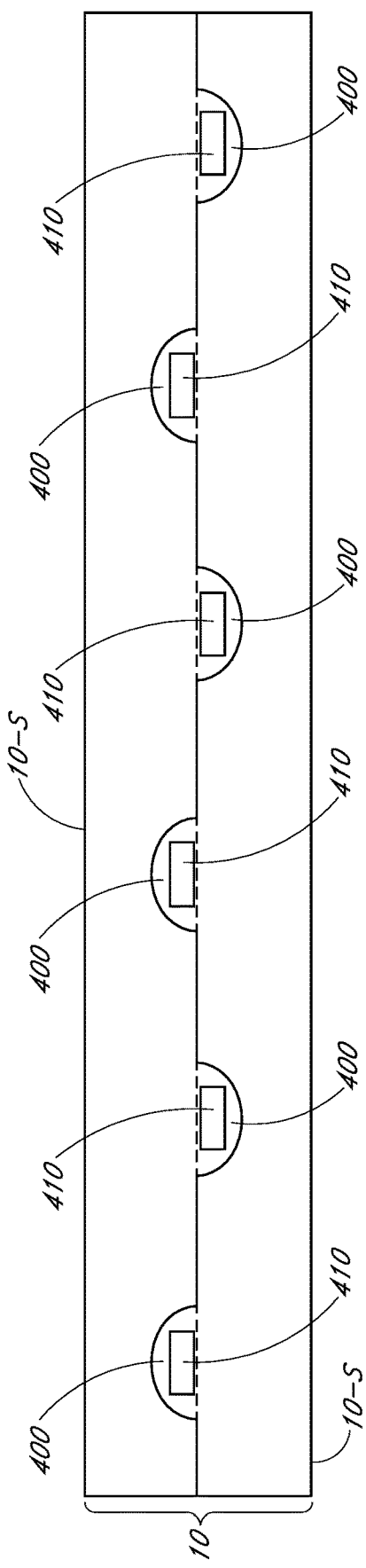
FIGS. 8A-8B show additional example sacrificial cells 10-S in which rear metallization pattern discrete contact pads are located on protrusions extending from an edge of the sacrificial cell, and an example of how two such sacrificial cells may be cut from a rectangular solar cell 10.
Figure 8B:
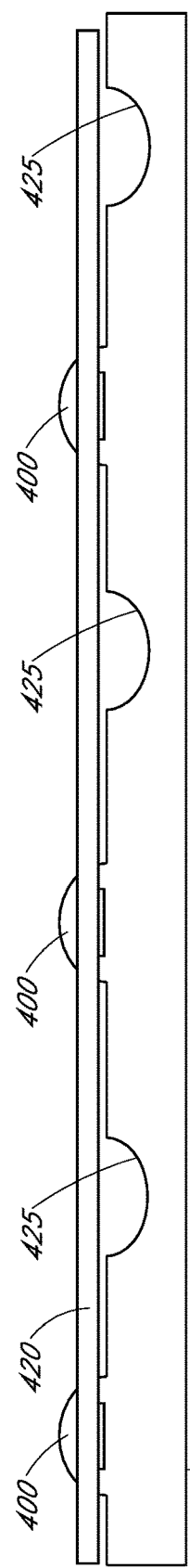

A sacrificial cells 10-S having protrusions as just described may be cut (e.g., laser cut), for example, from a rectangular solar cell 10 as shown in FIGS. 7A and 8A. In the example of FIG. 7A a single sacrificial cell 10-S is cut from a solar cell 10. In the example of FIG. 8A two sacrificial cells 10-S are cut from a single solar cell 10 that includes two rows of off-set discrete contact pads 410. In the example of FIG. 8A each sacrificial cell includes concave cut-outs 425 corresponding to the protrusions 400 on the sibling cell. In FIGS. 7A and 8A the dashed lines indicate the center line of the solar cell 10 from which the sacrificial cells are cut. In the example of FIG. 8A the cut is centered in the cell and inherently leads to wider sacrificial cells 10-S than can be produced by cutting only a single sacrificial cell 10-S from a solar cell 10 as in the example of FIG. 7A.

Sacrificial cells having protrusions as described herein may be cut to shape in a process as described above with respect to FIGS. 6A-6C by which a super cell comprising a sacrificial cell is cut from a longer shingled string of solar cells. That is, a cut separating a super cell from a longer shingled string of solar cells may have a shape that produces the desired protrusions along the edge of the sacrificial cell at the end of the separated super cell. Alternatively, sacrificial cells having protrusions as described herein may be cut to shape in a separate process, and then bonded to the end of a super cell.

This disclosure is illustrative and not limiting. Further modifications will be apparent to one skilled in the art in light of this disclosure and are intended to fall within the scope of the appended claims. For example, where methods and steps described above indicate certain events occurring in certain order, those of ordinary skill in the art will recognize that the ordering of certain steps may be modified, and that some steps may be omitted or additional steps added, and that such modifications are in accordance with the variations of the invention

What is claimed is:

1. A method for manufacturing a solar module, the method comprising:

arranging silicon solar cells in line with sides of adjacent silicon solar cells overlapping in a shingled manner, each silicon solar cell comprising a front surface, an oppositely positioned rear surface, an n-p junction between the front and rear surfaces, and a rear surface metallization pattern;

conductively bonding, for pairs of adjacent silicon solar cells, the rear surface of one of the silicon solar cells to a front surface of the other silicon solar cell to electrically and mechanically connect the silicon solar cells in series to form a first super cell comprising a shingled string of solar cells;

conductively bonding a first conductive metal ribbon to the rear surface metallization pattern of a first end silicon solar cell located at a first end of the first super cell to provide an electrical output from the first super cell having a first polarity; and conductively bonding a second conductive metal ribbon to the rear surface metallization pattern of a second end silicon solar cell located at a second end of the first super cell to provide an electrical output from the first super cell having a second polarity opposite from the first polarity, where the rear surface metallization of the first and second end silicon solar cells are both disposed on then side of the n-p junction or the rear surface metallization of the first and second end silicon solar cells are both disposed on the p side of the n-p junction.

2. The method of claim 1, wherein each of the plurality of silicon solar cells have identical front and rear surface metallization patterns.

3. The method of claim 1, further comprising:
arranging a plurality of super cells including the first super cell side-by-side and physically parallel with each other;
electrically connecting a first intermediate silicon solar cell located at a position intermediate between the ends of the first super cell to a correspondingly positioned solar cell in each of the other super cells in the plurality by one or more conductive interconnects extending transversely to the plurality of super cells.

4. The method of claim 3, wherein the one or more conductive interconnects extend transversely to the plurality of super cells electrically to segment each of the super cells into two or more groups of solar cells, and each group of solar cells is electrically in parallel with a corresponding bypass diode.

5. The method of claim 1, wherein the method further comprises arranging the first super cell to span or substantially span the solar module from a first edge of the solar module to an oppositely positioned second edge of the solar module.

6. The method of claim 5, wherein the method further comprises:
arranging the first end silicon solar cell adjacent to and spaced apart from the first edge of the solar module by a first distance;
arranging the second end silicon solar cell adjacent to and spaced apart from the second edge of the solar module by a second distance; and
the second distance is greater than the first distance such that the portion of the first super cell excluding the first end silicon solar cell is centered lengthwise along the solar module between the first edge and the second edge.

7. The method of claim 1, wherein conductively bonding the second conductive metal ribbon to the rear surface metallization pattern of the second end silicon solar cell comprises conductively bonding the second conductive metal ribbon to a plurality of rear surface discrete contact pads of the rear surface metallization pattern of the second end silicon solar cell.

8. The method of claim 1, wherein the method further comprises:
operating a first conveyor belt to advance the shingled string of solar cells across a gap between the first conveyor belt and a second collinearly arranged conveyor belt, the shingled string of solar cells thereby supported by the first conveyor belt and the second conveyor belt; and
making a laser cut through a solar cell positioned over the gap between the first conveyor belt and the second conveyor belt to separate the shingled string of solar cells.

9. The method of claim 8, comprising making the laser cut in a direction transverse to the long axis of the first super cell in a solar cell that is located at an end of the first super cell and overlaps a front surface of its adjacent solar cell, the laser cut trimming off a portion of the solar cell and thereby narrowing the solar cell.

10. A method for manufacturing a solar module, the method comprising:
forming a plurality of super cells by arranging silicon solar cells in line with sides of adjacent silicon solar cells overlapping in a shingled manner, each silicon solar cell comprising a front, an oppositely positioned rear surface, an n-p junction between the front and rear surfaces, and a rear surface metallization pattern; and
conductively bonding, for pairs of adjacent silicon solar cells, the rear surface of one of the silicon solar cells to a front surface of the other silicon solar cell to electrically and mechanically connect the silicon solar cells in series;
arranging the plurality of super cells side-by-side and physically parallel with each other;
conductively bonding a first conductive metal ribbon to the rear surface metallization pattern of a first end silicon solar cell located at a first end of each of the plurality of super cells to provide an electrical output from each super cell having a first polarity; and
conductively bonding a second conductive metal ribbon to the rear surface metallization pattern of a second end silicon solar cell located at a second end of each of the plurality of super cells to provide an electrical output from each super cell having a second polarity opposite from the first polarity,
where the rear surface metallization of the first and second end silicon solar cells are both disposed on then side of the n-p junction or the rear surface metallization of the first and second end silicon solar cells are both disposed on the p side of the n-p junction.

11. The method of claim 10, further comprising:
electrically connecting a plurality of first intermediate silicon solar cells located at a first intermediate position between the ends of each super cell via one or more conductive interconnects extending transversely to the plurality of super cells.

12. The method of claim 11, further comprising:
electrically connecting a plurality of second intermediate silicon solar cells located at a second intermediate position between the ends of each super cell via one or more conductive interconnects extending transversely to the plurality of super cells.

13. The method of claim 11, wherein the one or more conductive interconnects extend transversely to the plurality of super cells electrically to segment each of the super cells into two or more groups of solar cells.

14. The method of claim 13, further comprising electrically connecting each group of solar cells in parallel with a corresponding bypass diode.

15. The method of claim 14, further comprising electrically connecting each group of solar cells in parallel with a corresponding bypass diode in a junction box by one or more longitudinally extending conductors.

16. The method of claim 10, wherein arranging the plurality of super cells side-by-side and physically parallel with each other comprises arranging the plurality of super cells front surface side down on a transparent front sheet in a physical configuration desired for the module such that the first and second conductive metal ribbons are arranged in the desired physical configuration on the rear surfaces of the super cells.

17. The method of claim 10, wherein the method further comprises positioning an encapsulant layer between the plurality of super cells and a transparent front sheet.

18. The method of claim 10, wherein the method further comprises centering the super cells lengthwise along the length of the solar module.

\* \* \* \* \*